(12) United States Patent
Jin et al.

(10) Patent No.: US 11,875,998 B2
(45) Date of Patent: Jan. 16, 2024

(54) SUBSTRATE PROCESSING METHOD

(71) Applicant: WONIK IPS CO., LTD., Pyeongtaek-si (KR)

(72) Inventors: Kwang Seon Jin, Osan-si (KR); Jin Sung Chun, Seongnam-si (KR); Sang Jun Park, Yongin-si (KR); Byung Chul Cho, Hwaseong-si (KR); Jun Hyuck Kwon, Osan-si (KR)

(73) Assignee: WONIK IPS CO., LTD., Gyeonggi-do (KR)

( * ) Notice: Subject to any disclaimer, the term of this patent is extended or adjusted under 35 U.S.C. 154(b) by 0 days.

(21) Appl. No.: 17/118,270

(22) Filed: Dec. 10, 2020

(65) Prior Publication Data
US 2021/0193472 A1   Jun. 24, 2021

(30) Foreign Application Priority Data
Dec. 18, 2019   (KR) .................. 10-2019-0170121

(51) Int. Cl.
*H01L 21/306*   (2006.01)
*H01L 21/3065*   (2006.01)
*H01J 37/32*   (2006.01)

(52) U.S. Cl.
CPC ...... *H01L 21/3065* (2013.01); *H01J 37/3244* (2013.01); *H01J 37/32357* (2013.01); *H01J 37/32715* (2013.01); *H01J 2237/334* (2013.01)

(58) Field of Classification Search
CPC .......... H01J 2237/334; H01J 37/32357; H01J 37/3244; H01J 37/32715; H01J 37/32082;
(Continued)

(56) References Cited

U.S. PATENT DOCUMENTS 9,978,610 B2 *   5/2018   Fung ................. H01L 21/28568
10,186,426 B2   1/2019   Kanarik et al.
(Continued)

FOREIGN PATENT DOCUMENTS

TW   201637095 A   10/2016
TW   201835680 A   10/2018
(Continued)

*Primary Examiner* — Duy Vu N Deo
(74) *Attorney, Agent, or Firm* — William Park & Associates Ltd.

(57) ABSTRACT

A substrate processing method uses a substrate processing apparatus including a process chamber defining a processing space in the process chamber, a substrate support mounted in the process chamber to place a substrate on the substrate support, a gas sprayer for supplying a process gas onto the substrate support in the processing space, and a remote plasma generator connected to the process chamber. The method includes placing the substrate on the substrate support, continuously supplying a surface processing gas through the remote plasma generator onto the substrate, continuously supplying a purge gas onto the substrate, supplying plasma power to the remote plasma generator to activate the surface processing gas and supply the activated surface processing gas onto the substrate, and cutting off the plasma power supplied to the remote plasma generator and supplying an etching gas onto the substrate.

5 Claims, 4 Drawing Sheets

(58) Field of Classification Search
CPC ........... H01J 37/32449; H01L 21/3065; H01L 21/31122; H01L 21/6708; H01L 21/31116
USPC ............... 438/717, 719, 723, 736, 758, 770, 438/690–714, 712–714; 156/345.29, 156/345.3, 345.34, 345.35
See application file for complete search history.

(56) References Cited

U.S. PATENT DOCUMENTS

| | | |
|---|---|---|
| 10,692,724 B2 | 6/2020 | Smith et al. |
| 2016/0111298 A1* | 4/2016 | Kim .................. H01J 37/32357 438/724 |
| 2016/0211147 A1 | 7/2016 | Fukazawa |
| 2017/0076955 A1* | 3/2017 | Hudson ............. H01L 21/67167 |
| 2017/0186621 A1* | 6/2017 | Zaitsu ............... H01L 21/31116 |
| 2017/0256416 A1* | 9/2017 | Fischer ............. H01L 21/30655 |
| 2017/0345665 A1* | 11/2017 | Faguet ............. H01L 21/67069 |
| 2018/0182614 A1* | 6/2018 | Nozawa ............ H01L 21/02164 |
| 2019/0198301 A1 | 6/2019 | Ma et al. |
| 2021/0287911 A1 | 9/2021 | Kato et al. |

FOREIGN PATENT DOCUMENTS

| | | | |
|---|---|---|---|
| TW | 201920732 A | 6/2019 | |
| TW | 201929034 A | 7/2019 | |
| WO | WO-0079578 A1 * | 12/2000 | ....... H01L 21/30621 |

\* cited by examiner

SUBSTRATE PROCESSING METHOD

CROSS-REFERENCE TO RELATED PATENT APPLICATION

This application claims the benefit of Korean Patent Application No. 10-2019-0170121, filed on Dec. 18, 2019, in the Korean Intellectual Property Office, the disclosure of which is incorporated herein in its entirety by reference.

BACKGROUND

1. Field

The present invention relates to a semiconductor process and, more particularly, to a substrate processing method using an atomic layer etching (ALE) process.

2. Description of the Related Art

Currently, due to high integration of semiconductor devices, precision is required in a semiconductor device manufacturing process. As such, the thickness of a thin film deposited on a substrate is reduced and etching of the thin film is controlled in very small thickness units.

An atomic layer etching (ALE) process for etching a thin film in atomic or molecular layer units is currently used. Because the ALE process repeats cycle reaction to etch the thin film, precise thickness control is enabled but a long time is taken for the etching process. Therefore, a total time for a semiconductor device manufacturing process is increased and thus productivity is reduced.

SUMMARY

The present invention provides a substrate processing method capable of increasing productivity by reducing a process time. However, the scope of the present invention is not limited thereto.

According to an aspect of the present invention, there is provided a substrate processing method using a substrate processing apparatus including a process chamber defining a processing space in the process chamber, a substrate support mounted in the process chamber to place a substrate on the substrate support, a gas sprayer for supplying a process gas onto the substrate support in the processing space, and a remote plasma generator connected to the process chamber, the method including placing the substrate on the substrate support, continuously supplying a surface processing gas through the remote plasma generator onto the substrate on the substrate support, continuously supplying a purge gas onto the substrate on the substrate support, supplying plasma power to the remote plasma generator to activate the surface processing gas and supply the activated surface processing gas onto the substrate, and cutting off the plasma power supplied to the remote plasma generator and supplying an etching gas onto the substrate on the substrate support.

The surface processing gas may include a halogen element, and the surface processing gas activated by the plasma power may modify a surface functional group of the substrate by using the halogen element.

The surface processing gas may include one selected from the group consisting of HF, $NF_3$, and $F_2$ gases, or a combination thereof.

The etching gas may include an organic reaction gas reacting with a modified surface of the substrate to form a volatile compound.

The organic reaction gas may include one selected from the group consisting of trimethylamine (TMA), dimethylaluminum chloride, silicon tetrachloride ($SiCl_4$), and $Sn(acac)_2$ gases, or a combination thereof.

The remote plasma generator may use one of inductively coupled plasma (ICP), capacitively coupled plasma (CCP), and microwave plasma methods.

The supplying of the plasma power and the supplying of the etching gas may be configured as a unit cycle, and the unit cycle may be repeated one or more times.

The substrate processing method may further include supplying the etching gas onto the substrate before repeating the unit cycle a plurality of times.

The supplying of the plasma power and the supplying of the etching gas may be alternately and intermittently performed at time intervals.

BRIEF DESCRIPTION OF THE DRAWINGS

The above and other features and advantages of the present invention will become more apparent by describing in detail embodiments thereof with reference to the attached drawings in which.

DETAILED DESCRIPTION

Figure 1:
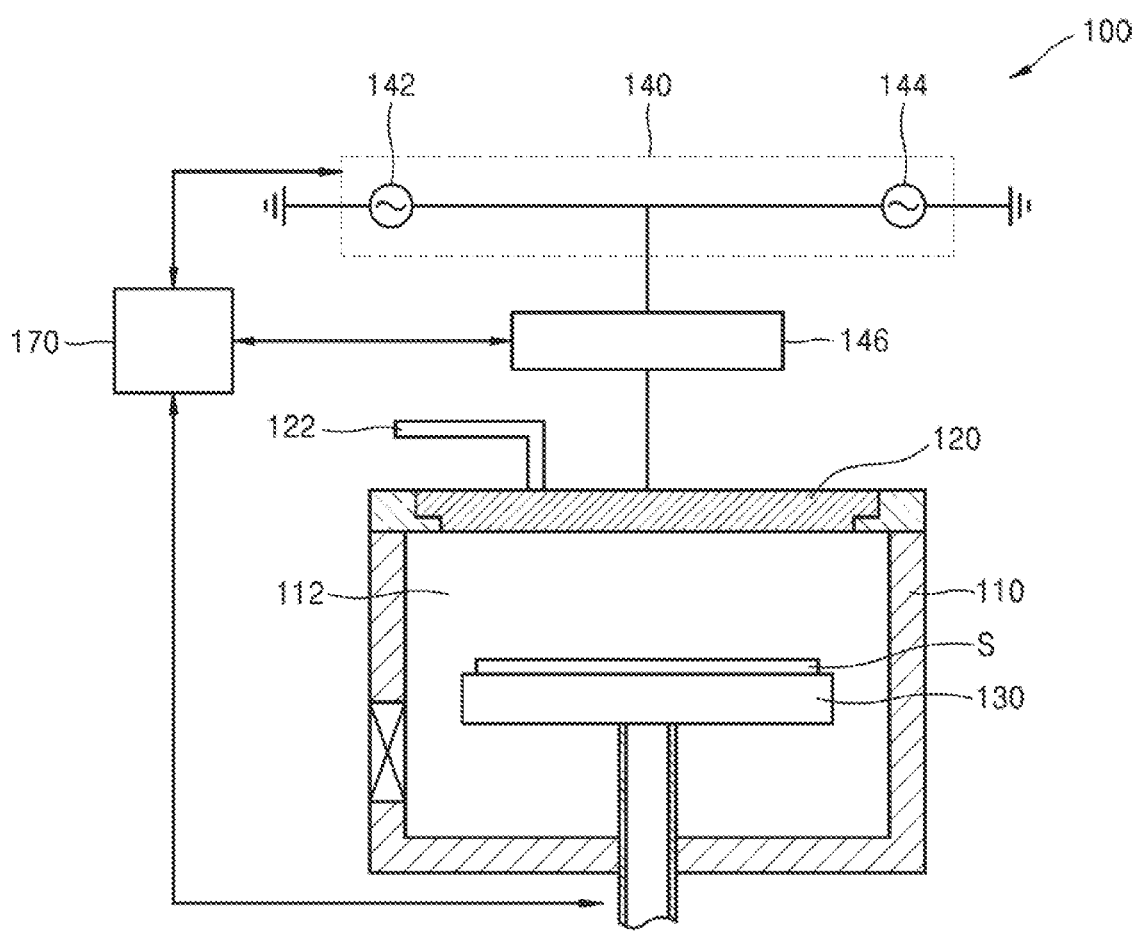
FIG. 1 is a cross-sectional view of a substrate processing apparatus for implementing a substrate processing method, according to an embodiment of the present invention.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses or sizes of layers are exaggerated for clarity or convenience of explanation.

FIG. 1 is a cross-sectional view of a substrate processing apparatus 100 for implementing a substrate processing method, according to an embodiment of the present invention.

Referring to FIG. 1, the substrate processing apparatus 100 may include a process chamber 110, a gas sprayer 120, and a substrate support 130.

The process chamber 110 may define a processing space 112 therein. For example, the process chamber 110 may be configured to maintain airtightness, and be connected through an exhaust port to a vacuum chamber (not shown) to discharge a process gas in the processing space 112 and adjust a vacuum level in the processing space 112. The process chamber 110 may be provided in various shapes and include, for example, a side wall defining the processing space 112 and a cover located at the top of the side wall.

The gas sprayer 120 may be mounted on the process chamber 110 to supply the process gas from outside the process chamber 110 through a gas inlet line 122 into the processing space 112. The gas sprayer 120 may be mounted on the process chamber 110 to face the substrate support 130 to spray the process gas onto a substrate S placed on the substrate support 130. The gas sprayer 120 may include at least one inlet hole connected to the gas inlet line 122, and a plurality of spray holes facing the substrate S downward to spray the process gas onto the substrate S.

For example, the gas sprayer 120 may have various shapes, e.g., a shower head shape and a nozzle shape. When the gas sprayer 120 has a shower head shape, the gas sprayer 120 may be coupled to the process chamber 110 to partially cover the top of the process chamber 110. For example, the gas sprayer 120 may be coupled to the cover or the side wall in the form of a lid of the process chamber 110.

The substrate support 130 may be mounted in the process chamber 110 to place the substrate S thereon. For example, the substrate support 130 may be mounted in the process chamber 110 to face the gas sprayer 120. Optionally, the substrate support 130 may include therein a heater (not shown) for heating the substrate S.

The substrate support 130 may have a shape almost corresponding to the shape of the substrate 5, but is not limited thereto and may have various shapes larger than the substrate S to stably place the substrate S thereon. In an example, the substrate support 130 may be connected to an external motor (not shown) so as to be lifted and, in this case, a bellow tube (not shown) may be connected to maintain airtightness. Furthermore, the substrate support 130 is configured to place the substrate S thereon, and thus may also be called a substrate mount, a susceptor, or the like.

Furthermore, the plasma power supply 140 may be connected to the gas sprayer 120 to supply power for forming a plasma atmosphere in the process chamber 110. For example, the plasma power supply 140 may include at least one radio frequency (RF) power supply to apply RF power to the process chamber 110. For example, the plasma power supply 140 may be connected to the gas sprayer 120 to apply the RF power. In this case, the gas sprayer 120 may be called a power supply electrode or an upper electrode.

The plasma power supply 140 may include one or more RF power supplies. For example, the RF power supplies may include a first RF power supply 142 for supplying power of a first frequency band to control a plasma environment according to a process condition, and a second RF power supply 144 for supplying power of a second frequency band higher than the first frequency band. A dual-frequency power supply including the first and second RF power supplies 142 and 144 may switch frequency bands according to a process condition or a process step and thus the process may be precisely controlled.

The plasma power supply 140 including two RF power supplies (i.e., 142 and 144) in FIG. 1 is merely an example, and the scope of the present invention is not limited thereto.

In an example of the plasma power supply 140, the first RF power supply 142 may be a low-frequency (LF) power supply for supplying power of the first frequency band including at least 370 kHz, and the second RF power supply 144 may be a high-frequency (HF) power supply for supplying power of the second frequency band including at least 27.12 MHz.

Specifically, the HF power supply may be an RF power supply for supplying power of, broadly, a frequency band ranging from 5 MHz to 60 MHz or, narrowly, a frequency band ranging from 13.56 MHz to 27.12 MHz. The LF power supply may be an RF power supply for supplying power of, broadly, a frequency band ranging from 100 kHz to 5 MHz or, narrowly, a frequency band ranging from 300 kHz to 600 kHz. In an embodiment, the second frequency band may range from 13.56 MHz to 27.12 MHz, and the first frequency band may range from 300 kHz to 600 kHz.

Additionally, an impedance matcher 146 may be provided between the plasma power supply 140 and the gas sprayer 120 to match impedances between an RF power supply and the process chamber 110. The RF power supplied by the plasma power supply 140 needs to be appropriately impedance-matched through the impedance matcher 146 between the plasma power supply 140 and the process chamber 110 so as to be effectively transmitted to the process chamber 110 without being reflected back from the process chamber 110.

In general, because an impedance of the plasma power supply 140 is fixed and an impedance of the process chamber 110 is not constant, an impedance of the impedance matcher 146 may be determined to match the impedance of the process chamber 110 to the impedance of the plasma power supply 140, but the scope of the present invention is not limited thereto.

The impedance matcher 146 may include a serial or parallel combination of two or more selected from the group consisting of resistors, inductors, and capacitors. Furthermore, the impedance matcher 146 may adopt at least one variable capacitor or capacitor array switching structure to vary the impedance value thereof according to a frequency of the RF power and a process condition.

In some embodiments, the impedance matcher 146 may include a tune capacitor connected in series to the plasma power supply 140, a load capacitor connected in parallel to the plasma power supply 140, and/or an inductor connected in series to the plasma power supply 140. Impedance values of the tune capacitor and the load capacitor may vary for impedance matching.

Optionally, the substrate support 130 may further include an electrostatic electrode (not shown) to fix the substrate S thereon by applying electrostatic force to the substrate S. In this case, the electrostatic electrode may receive direct current (DC) power from an electrostatic power supply.

The controller 170 may control various operations of the above-described substrate processing apparatus 100. For example, the controller 170 may control the impedance value of the impedance matcher 146, control a height of the substrate support 130, control an on/off state of the plasma power supply 140, or control supply of the process gas to the gas sprayer 120.

Figure 2:
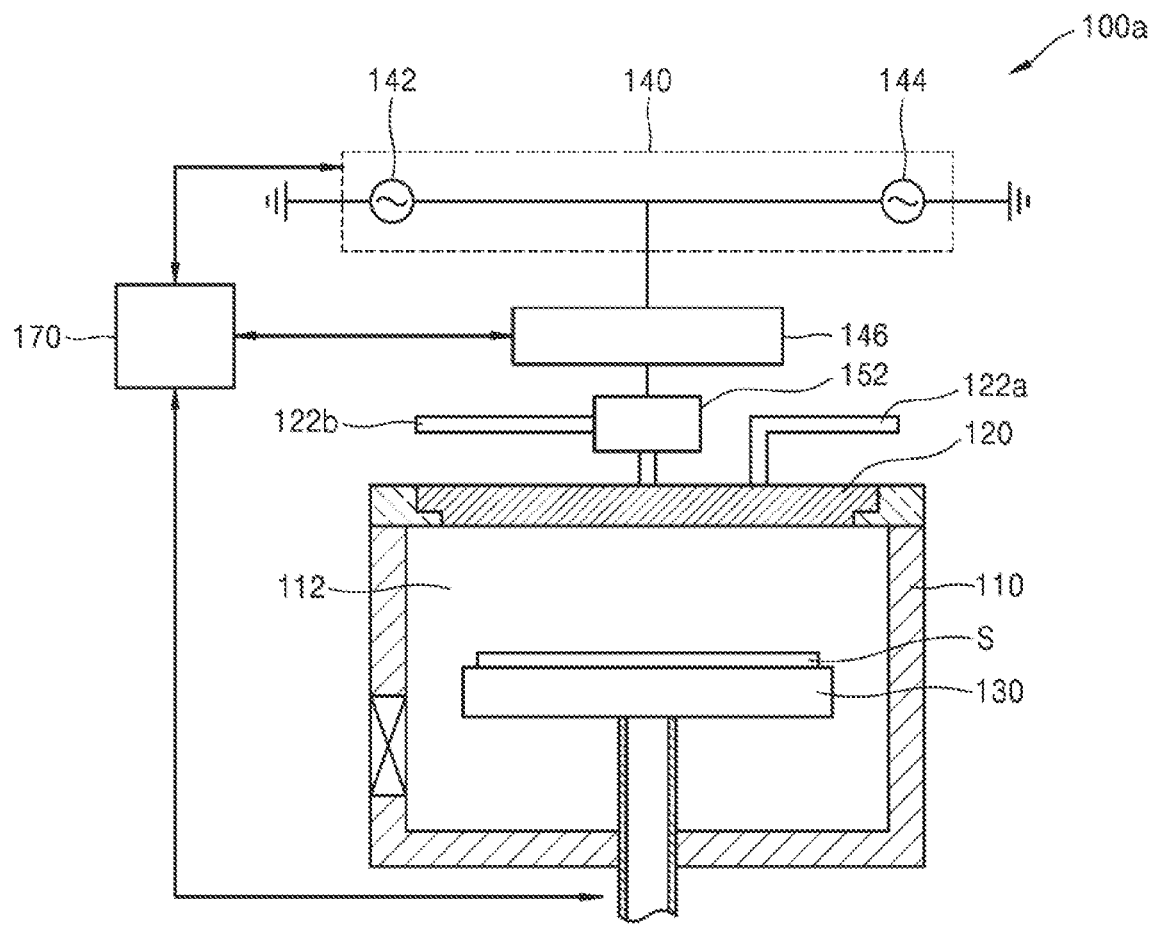
FIG. 2 is a cross-sectional view of a substrate processing apparatus for implementing a substrate processing method, according to another embodiment of the present invention.

FIG. 2 is a cross-sectional view of a substrate processing apparatus 100a for implementing a substrate processing method, according to another embodiment of the present invention. The substrate processing apparatus 100a of FIG. 2 is partially modified from the substrate processing apparatus 100 of FIG. 1, and thus a repeated description therebetween will not be provided herein.

Referring to FIG. 2, the substrate processing apparatus 100a may include a remote plasma generator 152 provided outside the process chamber 110 and connected to the process chamber 110. The remote plasma generator 152 may supply a part of a process gas into the process chamber 110 from outside the process chamber 110.

A part of the process gas may be provided through a gas inlet line 122a to the gas sprayer 120, and another part of the process gas may be supplied through a gas inlet line 122b into the remote plasma generator 152 and then be activated in the remote plasma generator 152 and be supplied into the process chamber 110.

The remote plasma generator 152 may receive power of the plasma power supply 140 to form a plasma atmosphere therein. For example, the process gas activated in the remote plasma generator 152 may be supplied to the gas sprayer 120 in the form of radicals.

Figure 3:
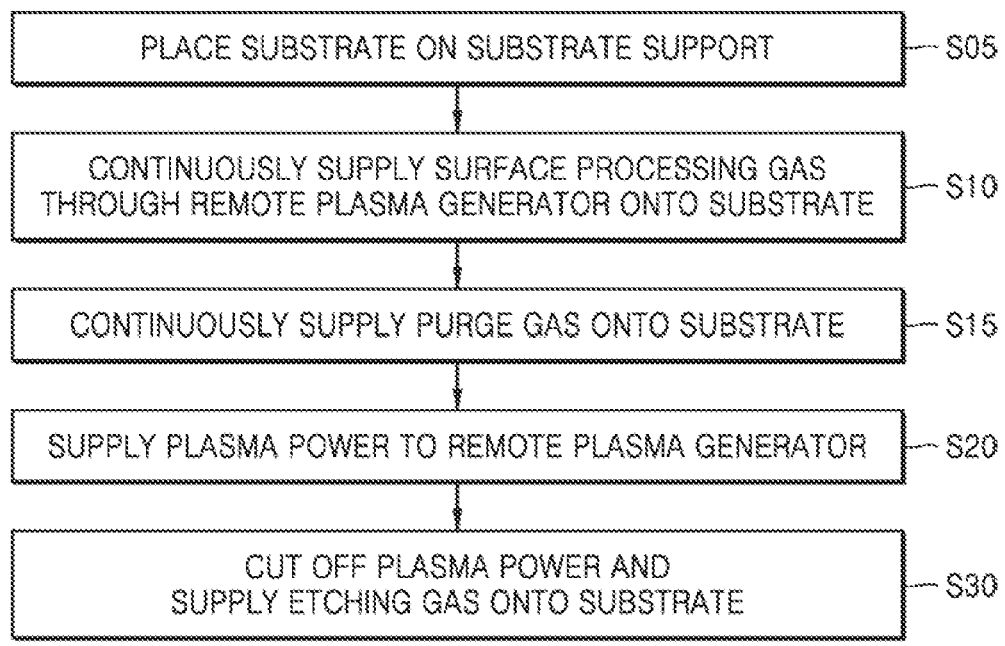
FIG. 3 is a flowchart of a substrate processing method according to an embodiment of the present invention.
Figure 4:
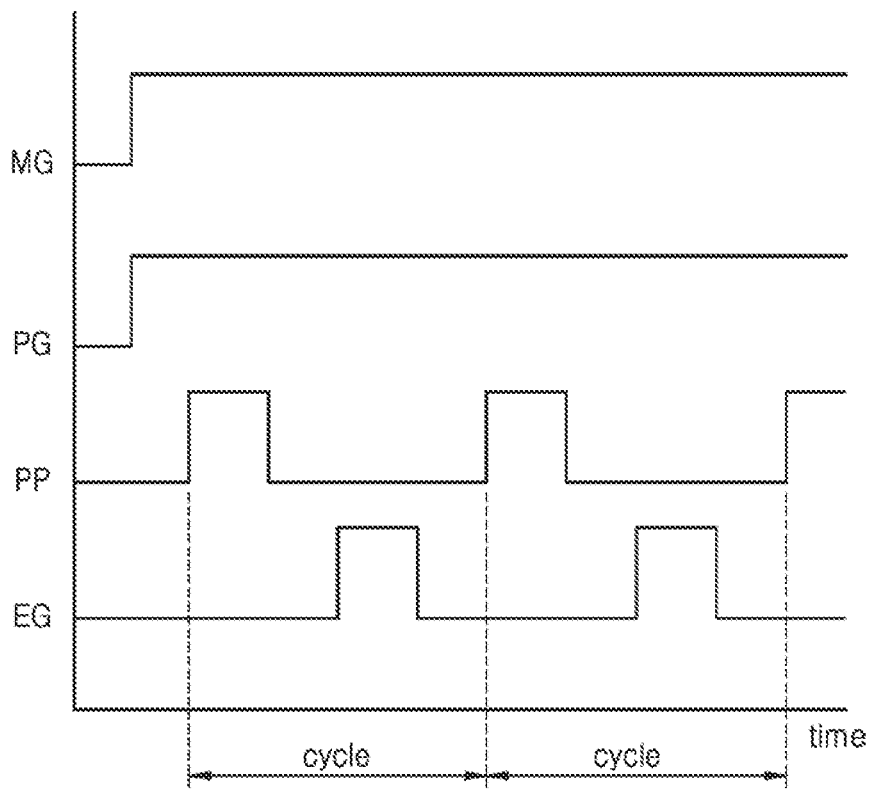
FIG. 4 is a graph for describing a substrate processing method according to an embodiment of the present invention.

FIG. 3 is a flowchart of a substrate processing method according to an embodiment of the present invention, and FIG. 4 is a graph for describing the substrate processing method according to an embodiment of the present invention.

The substrate processing method will now be described in detail with reference to the substrate processing apparatuses 100 and 100a of FIGS. 1 and 2.

Referring to FIGS. 1 to 4 together, the substrate processing method according to an embodiment of the present invention may include placing the substrate S on the substrate support 130 (S05), continuously supplying a surface processing gas MG through the remote plasma generator 152 onto the substrate S (S10), continuously supplying a purge gas PG onto the substrate S (S15), supplying plasma power PP to the remote plasma generator 152 to activate the surface processing gas MG (S20), and cutting off the plasma power PP and supplying an etching gas EG onto the substrate S (S30).

In some embodiments, the substrate processing method may configure the supplying of the plasma power PP (S20) and the supplying of the etching gas EG (S30) as a unit cycle, and repeat the unit cycle one or more times.

The above-described unit cycle may be a unit cycle of an atomic layer etching (ALE) process. The ALE process may refer to a method of supplying the surface processing gas MG onto the substrate S to process a surface of a thin film on the substrate S, purging the remaining surface processing gas MG, supplying the etching gas EG onto the substrate S to remove the surface-processed portion of the thin film based on reaction with the etching gas EG, purging the remaining etching gas EG, and repeating unit thin film removal cycle reaction to etch the thin film.

For example, in this ALE process, the surface processing gas MG may be adsorbed into a surface of the substrate S to modify a surface material of the substrate S, e.g., the surface of the thin film. The surface modification may be performed on the surface of the substrate S in atomic or molecular layer units. The modified surface material may react with the etching gas EG to form a volatile compound. Therefore, in the ALE process, the substrate S or the thin film on the substrate S may be etched in atomic or molecular layer units during unit cycle reaction.

FIG. 4 shows that the unit cycle is repeated two times, but the unit cycle in the substrate processing method may be repeated an appropriate number of times according to an amount by which the substrate S is processed. When the substrate S includes a thin film to be etched, the substrate processing method may repeat the unit cycle until the thin film is etched to a target thickness.

Specifically, in the continuous supplying of the surface processing gas MG (S10), the surface processing gas MG may be provided in an inactive state through the remote plasma generator 152. In this case, the inactive surface processing gas MG itself may not easily modify the surface material of the substrate S. To activate the surface processing gas MG, a plasma environment may be required.

In the continuous supplying of the purge gas PG (S15), the purge gas PG may be supplied through the remote plasma generator 152 or directly into the process chamber 110. The purge gas PG may include an inert gas, e.g., an argon gas.

In the supplying of the plasma power PP to activate the surface processing gas MG (S20), the plasma power PP may be intermittently provided only when activation of the surface processing gas MG is required. For example, when the plasma power PP is supplied, the inactive surface processing gas MG may be activated into radicals in a plasma atmosphere. Optionally, the plasma power PP may start to be supplied after a certain time for stabilization has passed from when the surface processing gas MG starts to be continuously supplied.

Therefore, in the current embodiment, although the surface processing gas MG is continuously supplied onto the substrate S, surface processing reaction, e.g., surface modification reaction, may occur not continuously but intermittently only when the plasma power PP is supplied.

For example, the surface processing gas MG may include a halogen element and, in this case, the surface processing gas MG activated by the plasma power PP may modify a surface functional group of the substrate S by using the halogen element. For example, the surface processing gas MG may include one selected from the group consisting of HF, $NF_3$, and $F_2$ gases, or a combination thereof.

In the supplying of the plasma power PP (S20), as illustrated in FIG. 2, the plasma power PP may be supplied into the remote plasma generator 152 to form a plasma atmosphere in the remote plasma generator 152 outside the process chamber 110. In this case, the surface processing gas MG may be supplied through the remote plasma generator 152 onto the substrate S in the process chamber 110.

Specifically, the surface processing gas MG may be supplied through the gas inlet line 122b into the remote plasma generator 152, be activated under the plasma atmosphere in the remote plasma generator 152, and then be supplied onto the substrate S in the process chamber 110. Plasma formed outside the process chamber 110 as described above may be called remote plasma. For example, the remote plasma generator 152 may use one of inductively coupled plasma (ICP), capacitively coupled plasma (CCP), and microwave plasma methods.

Meanwhile, as another example, in the supplying of the plasma power PP (S20), as illustrated in FIG. 1, the plasma power PP may be supplied into the process chamber 110 to form a plasma atmosphere in the process chamber 110. For example, as described above in relation to FIG. 1, the plasma power PP may be supplied from the plasma power supply 140 through the impedance matcher 146 to the gas sprayer 120 serving as a part of the process chamber 110.

In this case, the plasma atmosphere may be formed between the gas sprayer 120 and the substrate support 130. Plasma directly formed in the process chamber 110 as described above may be called direct plasma.

When the remote plasma generator 152 is used, an atmosphere in the process chamber 110 may be easily controlled compared to a case in which direct plasma is formed in the process chamber 110.

The supplying of the etching gas EG (S30) may be intermittently performed after the surface of the substrate S is processed. For example, the supplying of the etching gas EG (S30) may be performed for a certain time after a certain time has passed from when the supplying of the plasma power PP (S20) is performed.

For example, the supplying of the plasma power PP (S20) and the supplying of the etching gas EG (S30) may be alternately and intermittently performed at time intervals. Therefore, the supplying of the plasma power PP (S20) and the supplying of the etching gas EG (S30) may be performed at time intervals in the form of pulses. During the time intervals, a purge operation using the purge gas PG may be performed.

When the surface processing gas MG includes a halogen element, the etching gas EG may include an organic reaction gas to react with the surface of the substrate S modified by the surface processing gas MG, and form a volatile compound. For example, the organic reaction gas may include a gas including methyl, chloride, or acac ligands and capable of causing ligand exchange reaction while being volatilized in a stable state, e.g., one selected from the group consisting of trimethylamine (TMA), dimethylaluminum chloride, silicon tetrachloride ($SiCl_4$), and $Sn(acac)_2$ gases, or a combination thereof.

For example, the etching gas EG may be supplied through the gas inlet line 122 to the gas sprayer 120 in the substrate processing apparatus 100 of FIG. 1, and be supplied through the gas inlet line 122a to the gas sprayer 120 in the substrate processing apparatus 100a of FIG. 2.

In the current embodiment, as shown in FIG. 3, the etching gas EG may be supplied onto the substrate S at time intervals after the plasma power PP is intermittently supplied while the surface processing gas MG and the purge gas PG are being continuously supplied. In this case, while the inactive surface processing gas MG and the purge gas PG are being supplied, the activated surface processing gas MG may be supplied, the inactive surface processing gas MG and the purge gas PG may be supplied, the etching gas EG may be supplied, and then the inactive surface processing gas MG and the purge gas PG may be supplied onto the substrate S.

Meanwhile, in a modified embodiment of the current embodiment, before repeating the unit cycle, i.e., before the first unit cycle, the substrate processing method may further include previously supplying the etching gas EG. The previous supplying of the etching gas EG may be performed before the surface processing gas MG and the purge gas PG are supplied or while the two gases are being continuously supplied. The etching gas EG supplied before cycle reaction as described above does not perform an etching function because no surface-modified layer is present, but may help to previously form an etching gas atmosphere on the substrate S.

In the current embodiment, because the surface processing gas MG and the purge gas PG are supplied continuously, not in the form of pulses, a stabilization time which is required when the two gases are supplied in the form of pulses, may not be required. A time for supplying the surface processing gas MG and the purge gas PG does not need to be long. In particular, a time interval provided between the supplying of the plasma power PP (S20) and the supplying of the etching gas EG (S30) for operation of the purge gas PG may be reduced.

As such, a time for the unit cycle may be reduced compared to a general unit cycle, and a total time taken for the ALE process may be greatly reduced compared to a general ALE process.

Examples of the ALE process based on the thin film on the substrate S will now be described. The substrate S may include an insulating film used as a high-k dielectric film in a semiconductor memory device or as a blocking insulating film in a NAND flash memory.

For example, when the substrate S includes zirconium oxide on the surface thereof, the surface processing gas MG may include a fluorine-based surface processing gas including fluorine for surface-processing zirconium oxide into zirconium fluoride. The etching gas EG may include an organic reaction gas for reacting with zirconium fluoride to form a volatile zirconium compound.

As another example, when the substrate S includes aluminum oxide on the surface thereof, the surface processing gas MG may include a fluorine-based surface processing gas for surface-processing aluminum oxide into aluminum fluoride, and the etching gas EG may include an organic reaction gas for reacting with aluminum fluoride to form a volatile aluminum compound.

In these cases, the fluorine-based surface processing gas may include one selected from the group consisting of HF, $NF_3$, and $F_2$ gases, or a combination thereof. The organic reaction gas serving as the etching gas EG may include a gas including methyl, chloride, or acac ligands and capable of causing ligand exchange reaction while being volatilized in a stable state, e.g., one selected from the group consisting of TMA, dimethylaluminum chloride, $SiCl_4$, and $Sn(acac)_2$ gases, or a combination thereof.

A comparative example for sequentially supplying the surface processing gas MG and the purge gas PG, and a test example for continuously supplying the surface processing gas MG and the purge gas PG will now be comparatively described. In the following description, the comparative example and the test example are respectively expressed as sequential ALE and continuous ALE in terms of ALE type.

Figure 5:
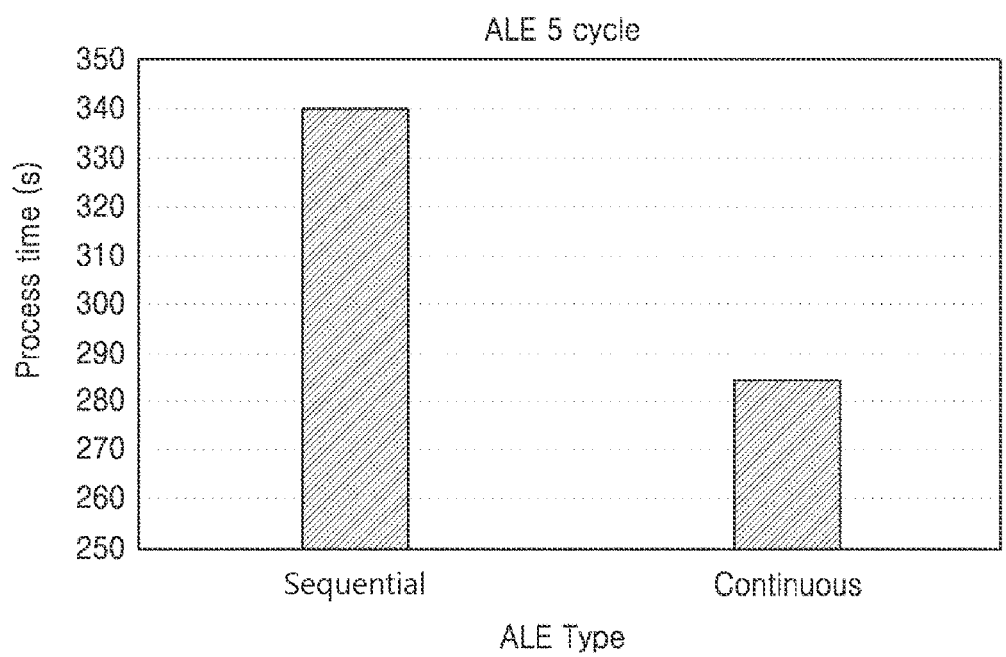
FIG. 5 is a graph showing substrate processing times of substrate processing methods according to a comparative example and a test example.

FIG. 5 is a graph showing substrate processing times of substrate processing methods according to a comparative example and a test example.

FIG. 5 shows that, when five cycles are performed, the test example may reduce a process time to ½ or less compared to the comparative example.

Figure 6:
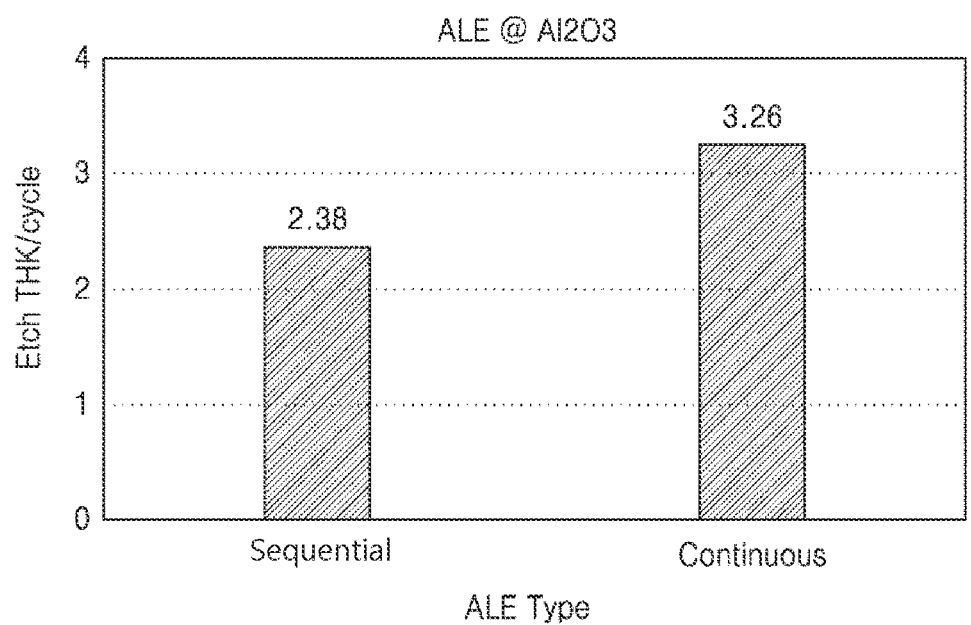
FIG. 6 is a graph showing thicknesses of thin films etched using substrate processing methods according to a comparative example and a test example.

FIG. 6 is a graph showing thicknesses of thin films etched using substrate processing methods according to a comparative example and a test example. The test of FIG. 6 is performed on samples including an $Al_2O_3$ thin film on a surface of the substrate S.

FIG. 6 shows that an etched thickness per unit cycle according to the test example is greater than the comparative example.

Thus, it is shown that the test example using continuous ALE may achieve a larger etched thickness per unit cycle and a shorter process time compared to the comparative example using sequential ALE. Therefore, based on a substrate processing method using an ALE process according to the present invention, a total substrate processing time may be reduced by reducing an ALE process time, and thus productivity may be increased.

Based on a substrate processing method according to the afore-described embodiments of the present invention, an ALE process time may be reduced and thus overall productivity may be increased. However, the scope of the present invention is not limited to the above-described effect.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A substrate processing method using a substrate processing apparatus comprising:
   a process chamber having a substrate support configured to place a substrate thereon;
   a plasma power supply configured to generate plasma power for forming a plasma atmosphere;
   a remote plasma generator configured to receive plasma power from the plasma power supply and activate a first process gas to form a plasma atmosphere of the activated first process gas in the remote plasma generator;
   a gas sprayer configured to receive the activated first process gas through a first gas inlet from the remote plasma generator and to receive a second process gas through a second gas inlet and for supplying a surface processing gas comprising one of the first process gas and the second process gas or both onto the substrate support in the process chamber, wherein the first gas inlet is connected to the remote plasma generator and the second gas inlet is not connected to the remote plasma generator,
   the substrate processing method comprising:
   continuously supplying the surface processing gas through at least the remote plasma generator onto the substrate support;
   continuously supplying a purge gas onto the substrate support;
   supplying plasma power to the remote plasma generator to activate the surface processing gas and supply the activated surface processing gas onto the substrate support; and
   cutting off the plasma power supplied to the remote plasma generator and supplying an etching gas through the second gas inlet onto the substrate on the substrate support
   wherein the surface processing gas comprises a halogen element,
   wherein the surface processing gas activated by the plasma power modifies a surface functional group of the substrate by using the halogen element,
   wherein the etching gas comprises one or more of dimethylaluminum chloride and $Sn(acac)_2$ gases reacting with a modified surface of the substrate to form a volatile compound,
   wherein the supplying of the plasma power and the supplying of the etching gas are configured as a unit cycle, and the unit cycle is repeated one or more times, and
   wherein the supplying the surface processing gas and supplying the purge gas are continuously performed during the unit cycle.

2. The substrate processing method of claim 1, wherein the surface processing gas comprises one or more of HF, $NF_3$, and $F_2$ gases.

3. The substrate processing method of claim 1, wherein the remote plasma generator uses one of inductively coupled plasma (ICP), capacitively coupled plasma (CCP), and microwave plasma methods.

4. The substrate processing method of claim 1, further comprising supplying the etching gas onto the substrate before repeating the unit cycle a plurality of times.

5. The substrate processing method of claim 1, wherein the supplying of the plasma power and the supplying of the etching gas are alternately and intermittently performed at time intervals.

* * * * *